(12) United States Patent
Sone (10) Patent No.: US 6,617,200 B2
(45) Date of Patent: Sep. 9, 2003

(54) SYSTEM AND METHOD FOR FABRICATING A SEMICONDUCTOR DEVICE

(75) Inventor: Masaaki Sone, Sakata (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/893,406

(22) Filed: Jun. 29, 2001

(65) Prior Publication Data

US 2002/0022304 A1 Feb. 21, 2002

(30) Foreign Application Priority Data

Jul. 5, 2000 (JP) ........................... 2000-204014

(51) Int. Cl.[7] ................ H01L 21/44; H01L 21/48; H01L 21/50; H01L 23/495; H01L 23/053; H01L 23/12; B29C 43/22
(52) U.S. Cl. .............. 438/123; 438/112; 257/666; 257/701; 264/272.17
(58) Field of Search .................. 438/112, 123; 257/666, 701; 264/272.17

(56) References Cited

U.S. PATENT DOCUMENTS

| | | | | |
|---|---|---|---|---|
| 3,672,046 A | * | 6/1972 | Storey, II et al. | 29/624 |
| 6,084,310 A | * | 7/2000 | Mizuno et al. | 257/779 |
| 6,242,797 B1 | * | 6/2001 | Ichikawa et al. | 257/666 |

* cited by examiner

Primary Examiner—Carl Whitehead, Jr.
Assistant Examiner—Nema Berezny
(74) Attorney, Agent, or Firm—Oliff & Berridge, PLC (57) ABSTRACT

The present invention provides a semiconductor device that makes it possible to expose the back side of a die pad as well as a method for fabricating the same. The semiconductor device can include a lead frame that has portions to be sandwiched by first and second molds and a die pad that is down set at a distance greater than the depth of a recessed part of the first mold. The die pad is placed on the bottom of the recessed part of the first mold and the lead frame is disposed so that the portions to be sandwiched are suspended above the first mold. The molding process is carried out as the second mold presses the portions of the lead frame to be sandwiched in the direction of the first mold.

7 Claims, 7 Drawing Sheets

$\alpha \geqq 15°$

FIG. 4

$D = (T/2) + (around\ 0.1\ to\ 0.2\ mm)$

SYSTEM AND METHOD FOR FABRICATING A SEMICONDUCTOR DEVICE

BACKGROUND OF THE INVENTION

1. Field of the Invention

The present invention relates to a semiconductor device, a method for fabricating the same, a circuit board and electronic devices.

2. Description of the Related Art

Currently, a package in which the back side of a die pad of a lead frame is exposed is known. However previously, in the fabrication process of this type of package, the molding process is carried out while a resin is being injected, so as to press the die pad against a mold. However, a problem with this technique is that it has not been possible to expose the die pad because the resin enters and remains between the die pad and the mold.

SUMMARY OF THE INVENTION

The present invention solves the foregoing problem. Accordingly, a purpose of the present invention is to provide a semiconductor device that makes it possible to expose the back side of a die pad, a method for fabricating the same, a circuit board and electronic devices.

The present invention provides a method for fabricating a semiconductor device by a molding process by setting a lead frame between first and second molds, wherein the lead frame has portions to be sandwiched by the first and second molds and a die pad down set at a distance greater than a depth of a recessed part of the first mold. The lead frame can be set by placing the die pad on the bottom of the recessed part of the first mold so that the portions to be sandwiched are suspended above the first mold and by using the second mold to press the portions to be sandwiched in the direction of the first mold.

According to the invention, the second mold presses the portions of the lead frame to be sandwiched by the first and second molds, and thereby the die pad is pressed against the bottom of the recessed part of the first mold. The molding process is carried out in this state. Thus, a sealing material does not enter between the die pad and the first mold and a part of the die pad can be exposed from a package.

In the method for fabricating this semiconductor device, a down set amount D of the die pad and a thickness T of the package formed in the molding process may have the relationship:

$$D=(T/2)+(\text{around } 0.1 \text{ to } 0.2 \text{ mm}).$$

In the method for fabricating this semiconductor device, a pilot pin can be disposed on the first mold, a hole cab be formed in the lead frame, and the pilot pin can be fit into the hole to position the lead frame. Further, the pilot pin may have a tapered tip end and a base end raised from the first mold vertically.

According to this, the pilot pin has the tip end tapered, and thus it is easily fit into the hole of the lead frame. Additionally, the pilot pin can accurately position the lead frame with a small clearance to the hole at the base end raised from the first mold vertically.

In the method for fabricating this semiconductor device, the lead frame has an outer frame and bridge pins for coupling the die pad to the outer frame. Further, the down set amount D may be secured by forming the bridge pins from the die pad at an angle of about 15° or greater.

According to this, the angle between the bridge pin and the die pad is large (about 15° or greater), and thus the sealing material near the bridge pins can be prevented from falling off.

Additionally, a semiconductor device, circuit board and electronic device including the semiconductor device of the present invention can be fabricated by the method described above.

BRIEF DESCRIPTION OF THE DRAWINGS

The invention will be described with reference to the accompanying drawings, in which like elements are referred to with like numbers, and in which.

DETAILED DESCRIPTION OF PREFERRED EMBODIMENTS

Hereafter, preferred embodiments of the present invention will be described in reference with the drawings, however, it should be understood that the present invention is not limited to the embodiments described below.

Figure 1:
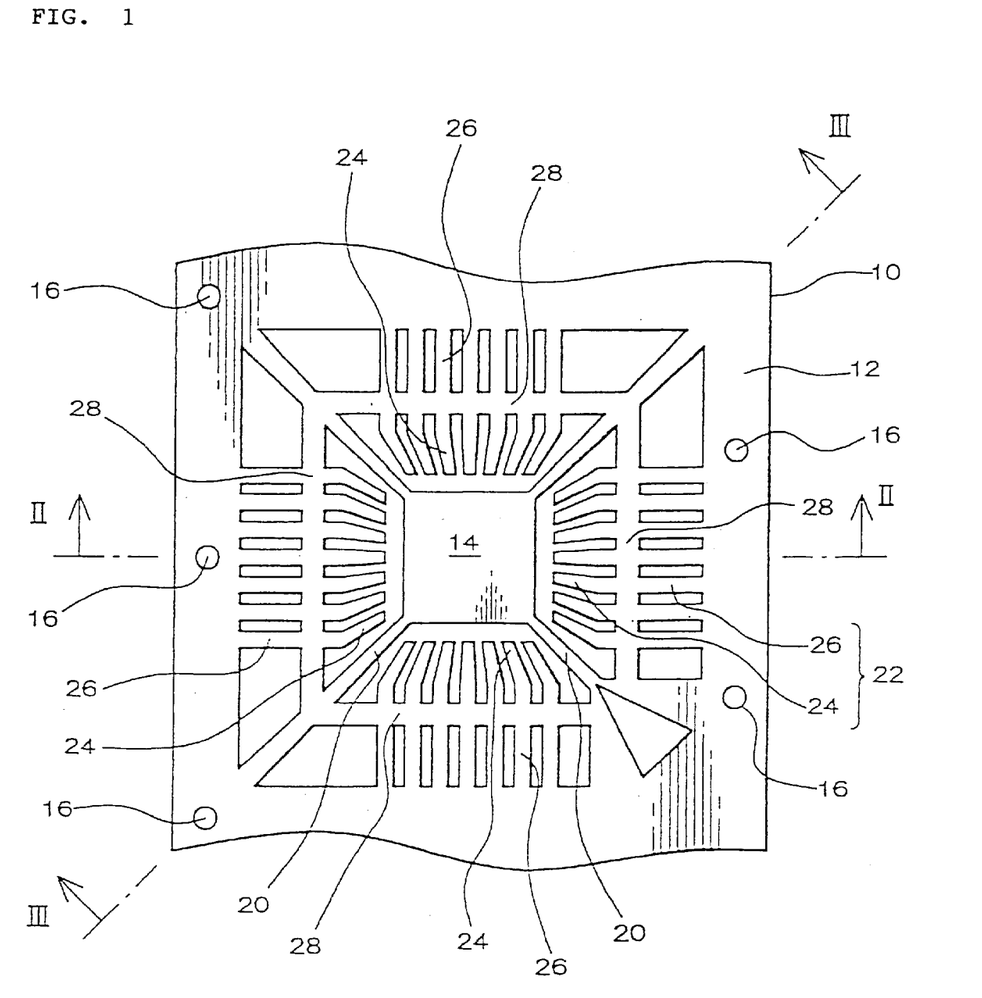
FIG. 1 is a diagram illustrating a lead frame according to an embodiment that applies the present invention.
Figure 2:
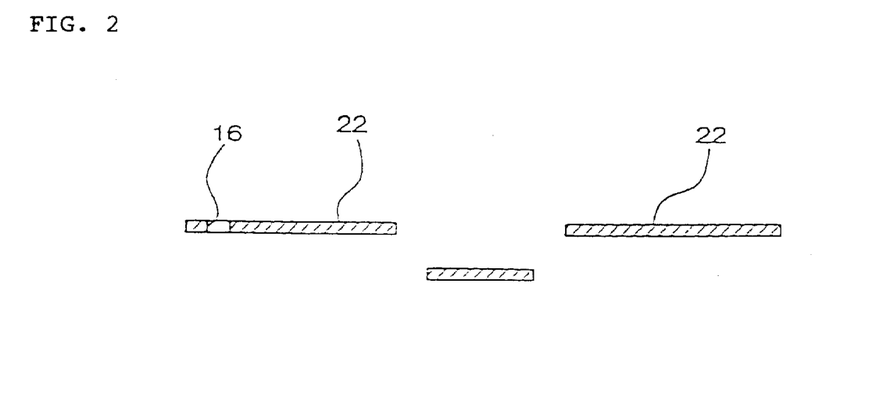
FIG. 2 is a sectional view of the lead frame along a line II—II shown in FIG. 1.
Figure 3:
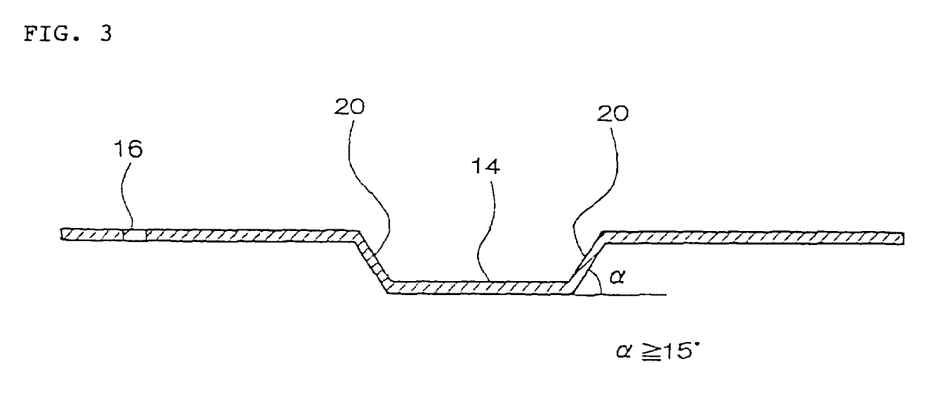
FIG. 3 is a sectional view of the lead frame along a line III—III shown in FIG. 1.
Figure 4:
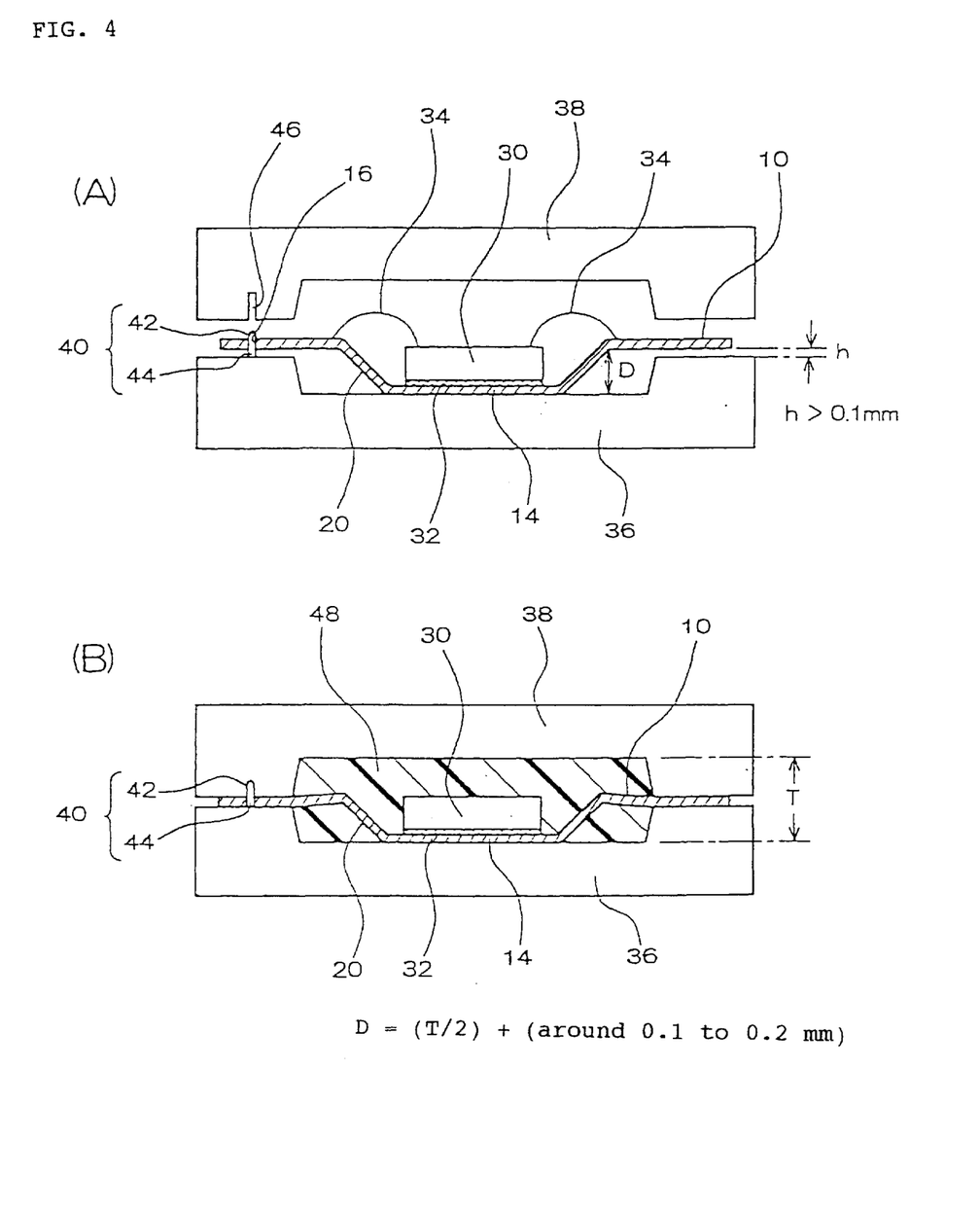
FIGS. 4(A) and 4(B) are illustrations showing a method for fabricating a semiconductor device according to an embodiment that applies the present invention.

FIG. 1 is a diagram illustrating a lead frame according to this embodiment. FIG. 2 is a sectional view along a line II—II shown in FIG. 1. FIG. 3 is a sectional view along a line III—III shown in FIG. 1. FIGS. 4(A) and 4(B) are illustrations showing a molding process.

A lead frame 10 is formed by working a copper-based or iron-based plate material. To the working method can include applying chemical etching or mechanical punching. The lead frame 10 has an outer frame 12. The outer frame 12 is often formed in a rectangular shape and the shape of the outer frame 12 becomes the outer shape for the lead frame 10.

On the outer frame 12, at least one hole (jig hole) 16 is formed. The hole 16 is formed to fit a pilot pin 40 that is disposed in a first mold for molding (see FIG. 4(A)). Accordingly, by using the pilot pin 40 and the hole 16, positioning the lead frame 10 to the first mold 36 can be easily accomplished. At least one hole 16 may be formed on both ends of the outer frame 12. In this case, the hole 16 formed on one end of the outer frame 12 (for example, the left side end in FIG. 1) and the hole 16 formed on the other end of the outer frame 12 (for example, the right side end in FIG. 1) are preferably formed at positions shifted in the length direction of the outer frame 12 (for example, the vertical direction in FIG. 1). Accordingly, the combination of hole 16 can be used to position the lead frame 10 on the first mold 36 in a proper orientation.

The lead frame 10 can include at least one die pad 14 (although only one die pad is shown in FIG. 1, generally, more than one is provided). The die pad 14 is a portion where an electronic part, such as a semiconductor chip 30 (see FIG. 4(A)) is mounted, which is often formed in a rectangular or square shape. The die pad 14 can be connected to the outer frame 12 by bridge pins (tie bars or bridge leads) 20.

As shown in FIG. 3, the bridge pins 20 can be bent, as shown in FIG. 3 and the die pad 14 is shifted down with respect to the outer frame 12. The semiconductor chip 30 is mounted on the of the die pad 14 that is opposite the direction in which the die pad 14 has been shifted down with respect to the outer frame 12. That is, the die pad 14 is down set within the structure.

In the embodiment, as shown in FIG. 4(A), the die pad 14 is down set at a distance greater than the depth of a recessed part (the area where a cavity for molding is formed) of the first mold 36. That is, a down set amount D of the die pad 14 is set so that the portions of the lead frame 10 to be sandwiched (at least one of the outer frame 12, outer leads 26 and dam bars 28) are suspended above the portions of the first mold 36 where the lead frame 10 is inserted. A suspension height h of the lead frame 10 is preferably set 0.1 mm or greater. In this manner, as shown in FIG. 4(B), the portions of the lead frame 10 to be sandwiched are pressed against the direction of the first mold 36 by a second mold 38, and thereby the molding process can be carried out as the die pad 14 is being pressed against the first mold 36. Accordingly, a sealing material 48 can be prevented from entering between the die pad 14 and the first mold 36.

Additionally, when the outer leads 26 are drawn from nearly the middle of the thickness of a package formed of the sealing material 48, the down set amount D of the die pad 14 and a thickness T of the package formed in the molding process preferably have the following relationship:

$$D=(T/2)+(around\ 0.1\ to\ 0.2\ mm),$$

as shown in FIGS. 4(A) and 4(B). In this manner, when the lead frame 10 is set on the first mold 36 as shown in FIG. 4(A), the portions of the lead frame 10 to be sandwiched (at least one of the outer frame 12, the outer leads 26 and the dam bars 28) can be suspended above the first mold 36.

Additionally, in the embodiment, the position of the die pad 14 is set so as to raise the position of inner leads 24 higher than a pad (not shown) of the semiconductor chip 30 as shown in FIG. 4(A) or 4(B).

As shown in FIG. 3, an angle ac (a bend angle of the bridge pin 20) between the bridge pin 20 and the die pad 14 is preferably 15° or greater, more preferably, 30° or greater. According to this, the bridge pins 20 enter deep into the sealing material 48 at a steep angle as shown in FIG. 4(B), and thus the sealing material 48 can be prevented from falling off near the bridge pins 20.

The lead frame 10 has a plurality of leads 22. The leads 22 are disposed to extend from the outer frame 12 toward the die pad 14. Specifically, the leads 22 include the inner leads 24 and the outer leads 26. The inner leads 24 are the portions to be sealed with the sealing material 48 (see FIG. 8) in the semiconductor device. The outer leads 26 are the portions to be drawn out of the sealing material 48, and are the portions that are used for making electrical connection to the outside.

The outer leads 26 are extended from the outer frame 12 orthogonally to each side of the rectangular die pad 14. The inner leads 24 converge from the outer leads 26 toward a center part of the die pad 14. The adjacent leads 22 are coupled to each other by the dam bar 28. Specifically, the dam bar 28 couples the portions of the adjacent outer leads 26 to each other near the inner leads 24.

It should be understood that in addition to the lead frame 10 of the embodiment, the present invention can also be applied to other well known lead frame configurations without departing from the spirit and scope are applied in addition to the configuration described above.

FIGS. 4(A) and 4(B) are illustrations showing the method for fabricating a semiconductor device according to an embodiment of the present invention. First, the above-mentioned lead frame 10 is prepared and the semiconductor chip 30 is fixed to the die pad 14 (the die bonding process). For example, the die pad 14 is bonded to the semiconductor chip 30 with an adhesive 32. A thermosetting resin may be used as the adhesive 32, but a material having a high thermal conductivity such as a metal paste (silver paste) may be used. Additionally, the bridge pins 20 may be bent as shown in FIG. 3 before the die bonding process, or the bridge pins 20 may be bent after the die bonding process.

Next, the wire bonding process is carried out. For example, wires 34 (see FIG. 4(A)) are bonded to the pad (not shown) of the semiconductor chip 30 and the inner leads 24 (see FIG. 1). In this process, any wire bonding technique can be used. However, in the embodiment, since the inner leads 24 are set at a position higher than the pad of the semiconductor chip 30, the loop height of the wires 34 is adjusted correspondingly.

Subsequently, the molding process is carried out. In detail, the lead frame 10 mounted with the semiconductor chip 30 is set on the first mold (a metal mold, for example) 36 for molding as shown in FIG. 4(A). Then, the lead frame 10 is sandwiched by the first mold 36 and the second mold (a metal mold, for example) 38. Each of the first and second molds 36 and 38 is formed with a recessed part. Both of the recessed parts cooperate to form a cavity of the molds.

The periphery of the recessed part of the first mold 36 works to sandwich a part of the lead frame 10. In the portion of the first mold 36 where a part of the lead frame 10 is inserted, a pilot pin 40 is disposed. In the periphery (it works to sandwich a part of the lead frame) of the recessed part of the second mold 38, a hole 46 for receiving the pilot pin 40 is disposed.

As shown, the pilot pin 40 can have a tapered tip end 42 and a base end 44 raised from the first mold 36. The tip end 42 has a tapered tip, and thus it is easily fit into the hole 16 of the lead frame 10. The base end 44 is set to have the dimensions similar to the dimensions of the hole 16 of the lead frame 10 (slightly smaller). The base end 44 is fit into the hole 16 with a small clearance and thus the lead frame 10 can be securely positioned. Furthermore, the base end 44 is raised from the first mold 36 vertically. Therefore, the lead frame 10 can be positioned even when the portions of the lead frame 10 near the hole 16 are suspended above the first mold 36. As the precondition thereof, the suspension height of the lead frame 10 is needed to be within the range of the height of the base end 44.

The lead frame 10 is set so as to bring the die pad 14 into contact with the bottom of the recessed part of the first mold 36. Then, a part of the lead frame 10 to be sandwiched (specifically, the outer leads 26, the dam bars 28 and the outer frame 12) is in a state suspended above the portions to sandwich a part of the lead frame 10 (specifically, the outer leads 26, the dam bars 28 and the outer frame 12) in the first mold 36.

The suspension height h of the lead frame 10 is preferably about 0.1 mm or greater. In this manner, the molding process is carried out during which the lead frame 10 is being pressed by the second mold (a metal mold, for example) 38 in the direction of the first mold 36, and thereby the die pad 14 is pressed against the first mold 36, as shown in FIG. 4(B). Accordingly, the sealing material can be prevented from entering between the die pad 14 and the bottom of the recessed part of the first mold 36.

When the outer leads 26 are drawn out of nearly the middle of the thickness of the package formed of the sealing material 48, the down set amount D of the die pad 14 and the thickness T of the package formed in the molding process preferably have the following relationship:

$$D=(T/2)+(\text{around } 0.1 \text{ to } 0.2 \text{ mm}),$$

as shown in FIGS. 4(A) and 4(B). In this manner, when the lead frame 10 is set on the first mold 36, as shown in FIG. 4(A), the lead frame 10 can be suspended above the first mold 36.

Then, the semiconductor chip 30, the wires 34 and the inner leads 24 are sealed with the sealing material (a molding resin) 48. As the sealing material 48, a thermosetting resin can be used.

In the embodiment, the die pad 14 is being pressed against the bottom of the recessed part of the first mold 36 when carrying out the molding process, and thus the sealing material 48 hardly enters between the die pad 14 and the first mold 36. Consequently, burrs are hardly generated on the die pad 14.

Figure 5:
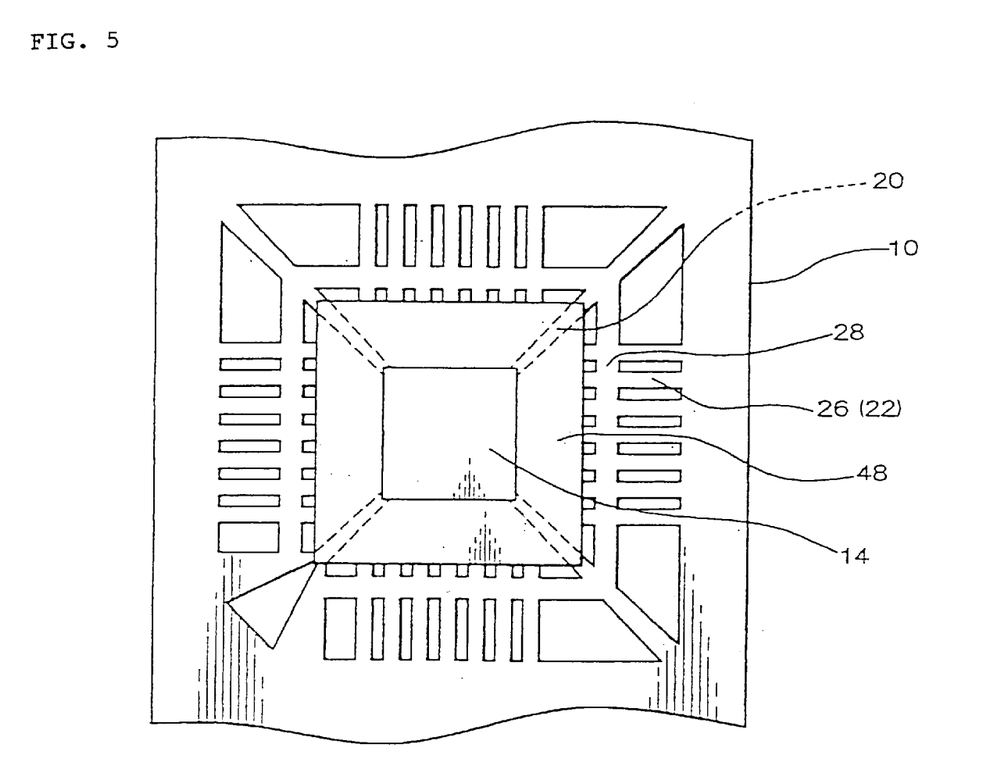
FIG. 5 is an illustration showing a method for fabricating a semiconductor device according to an embodiment that applies the present invention.

FIG. 5 is a diagram illustrating the lead frame 10 taken out of the first and second molds 36 and 38 after the sealing material 48 has been cured. Additionally, the lead frame 10 shown in FIG. 5 is illustrated as it is seen from the back side of the lead frame 10 shown in FIG. 1. As shown in FIG. 5, one side of the die pad 14 is exposed from the sealing material 48. When the burrs are generated in the front surface of the leads 22 in this state, the deburr process will be carried out.

Figure 6:
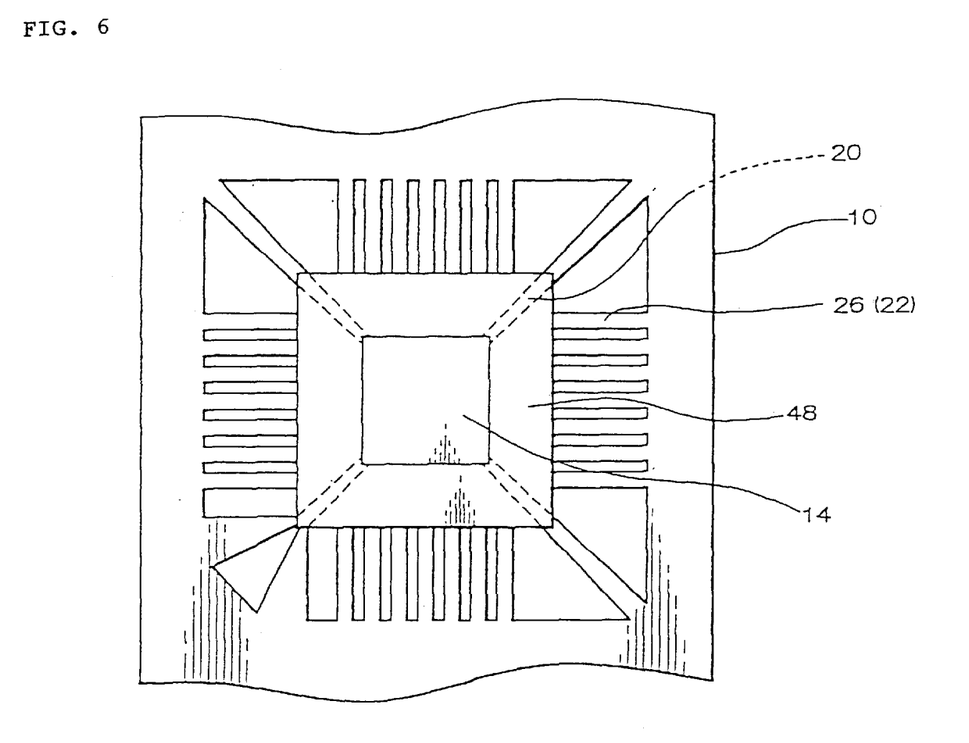
FIG. 6 is an illustration showing a method for fabricating a semiconductor device according to an embodiment that applies the present invention.

Next, the first trimming process is carried out as shown in FIG. 6. That is, the dam bars 28 coupling the leads 22 to each other are cut. Once the dam bars 28 have been cut, the cut surfaces of the dam bars 28 can be plated by a subsequent electroplating process. In the embodiment, the bridge pins 20 are not cut at this time.

Once cut, the electroplating process can be carried out. In other words, a film of a brazing filler metal (a solder, for example) or a metal such as tin is formed on the portions of the lead frame 10 exposed from the sealing material 48.

For example, a plurality of outer leads 26 are coupled to the outer frame 12, which are electrically connected through the outer frame 12, and thus electroplating is possible. Additionally, the die pad 14 is coupled to the outer frame 12 through the bridge pins 20, which is electrically connected through the bridge pins 20, and therefore electroplating is possible. Forming the metal film in this manner enhances the corrosion resistance. Furthermore, when plating with a brazing filler metal, such as solder is applied, joining the outer leads 26 to a wiring pattern or the die pad 14 to a heat radiating member 54 (see FIG. 8) can easily accomplished.

Figure 7:
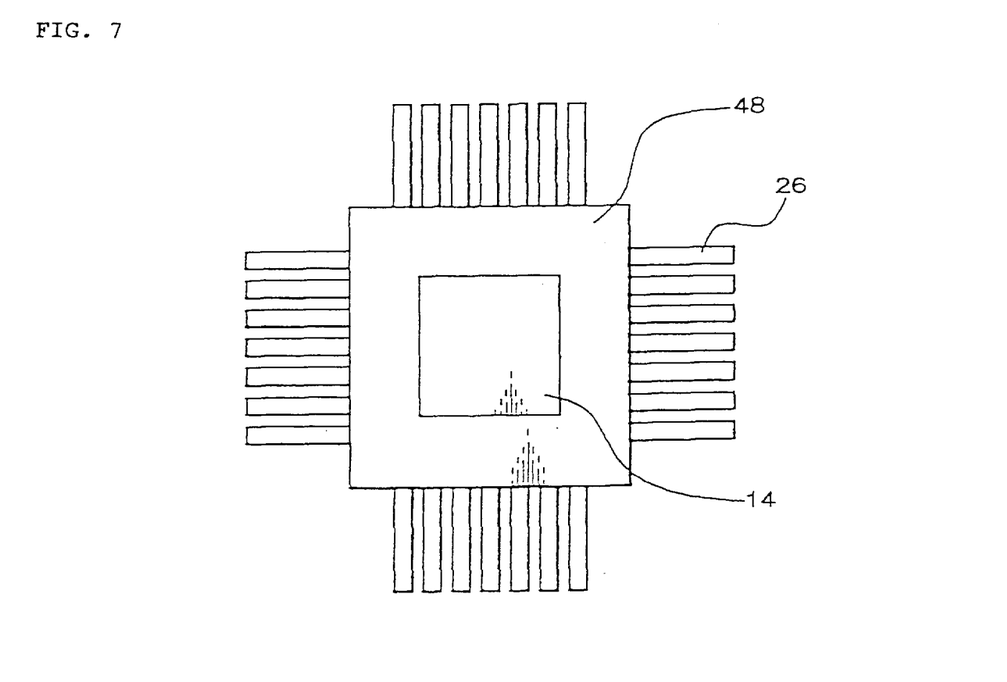
FIG. 7 is an illustration showing a method for fabricating a semiconductor device according to an embodiment that applies the present invention.

Next, the second trimming process is carried out as shown in FIG. 7. That is, the outer leads 26 are cut from the outer frame 12 and the bridge pins 20 are removed. Subsequently, a marking process is carried out, if necessary, and then a forming process is carried out. In other words, the outer leads 26 are bent into the form to easily be mounted on a circuit board. The second trimming process and the forming process may be carried out at the same time. After that, semiconductor devices can be fabricated through the processes described earlier including the inspection process.

Figure 8:
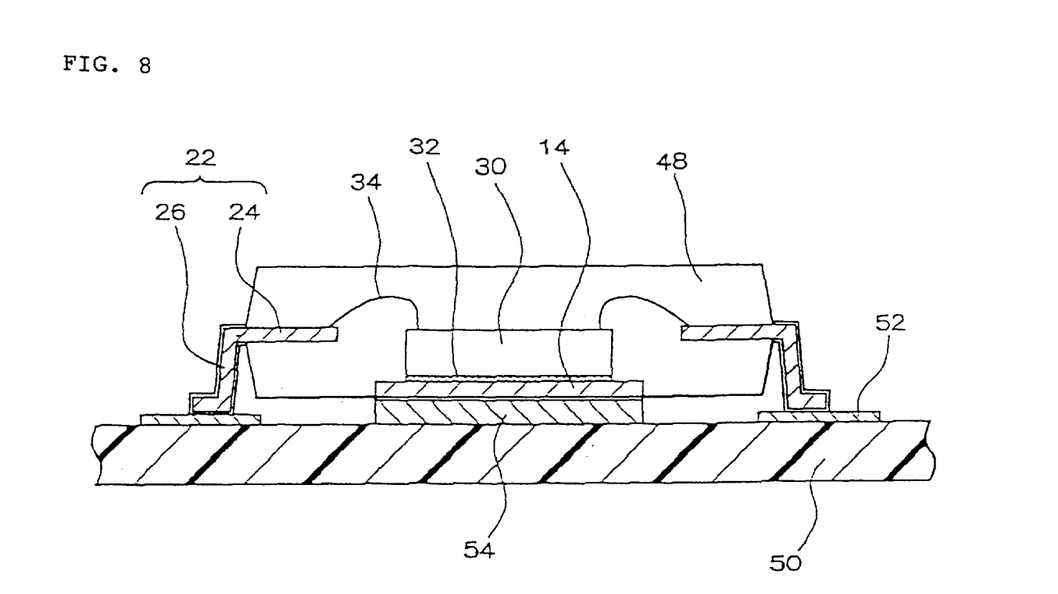
FIG. 8 is a diagram illustrating a circuit board mounted with a semiconductor device according to an embodiment that applies the present invention.

FIG. 8 is a diagram illustrating a semiconductor device according to an embodiment of the present invention. The semiconductor device of the embodiment has the semiconductor chip 30, the die pad 14 and the sealing material 48. One side of the die pad 14 is exposed from the sealing material 48.

In the embodiment, a bent angle of the bridge pin 20 is large (15° or greater) as shown in FIG. 3. Thus, the bridge pins 20 enter deep into the sealing material 48 and removal of the sealing material 48 hardly occurs.

In FIG. 8, the semiconductor device is mounted on a circuit board 50. For the circuit board 50, an organic substrate, such as a glass epoxy substrate, is generally used. On the circuit board 50, a wiring pattern 52 made of copper is formed into a desired circuit and the wiring pattern 52 is joined to the outer leads 26 of the semiconductor device. Additionally, the heat radiating member (heat spreader) 54 is disposed on the circuit board 50. The heat radiating member 54 is joined to the exposed surface of the die pad 14 of the semiconductor device. In this manner, heat generated in the semiconductor chip 30 can be dissipated from the heat radiating member 54 through the die pad 14. Other configurations of the semiconductor device in the embodiment are as described in the method for fabricating the semiconductor device and the above-mentioned lead frame 10.

Figure 9:
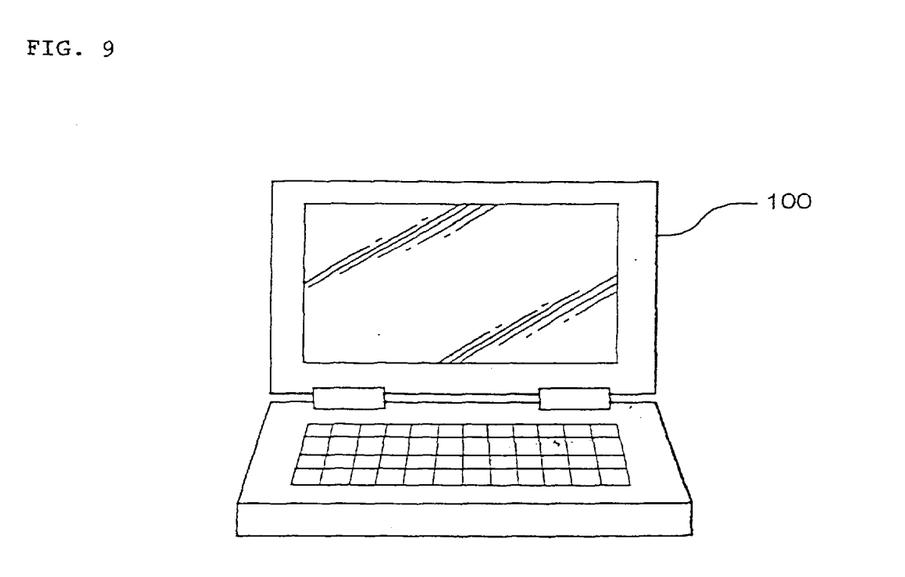
FIG. 9 is a diagram illustrating an electronic device having a semiconductor device according to an embodiment that applies the present invention.
Figure 10:
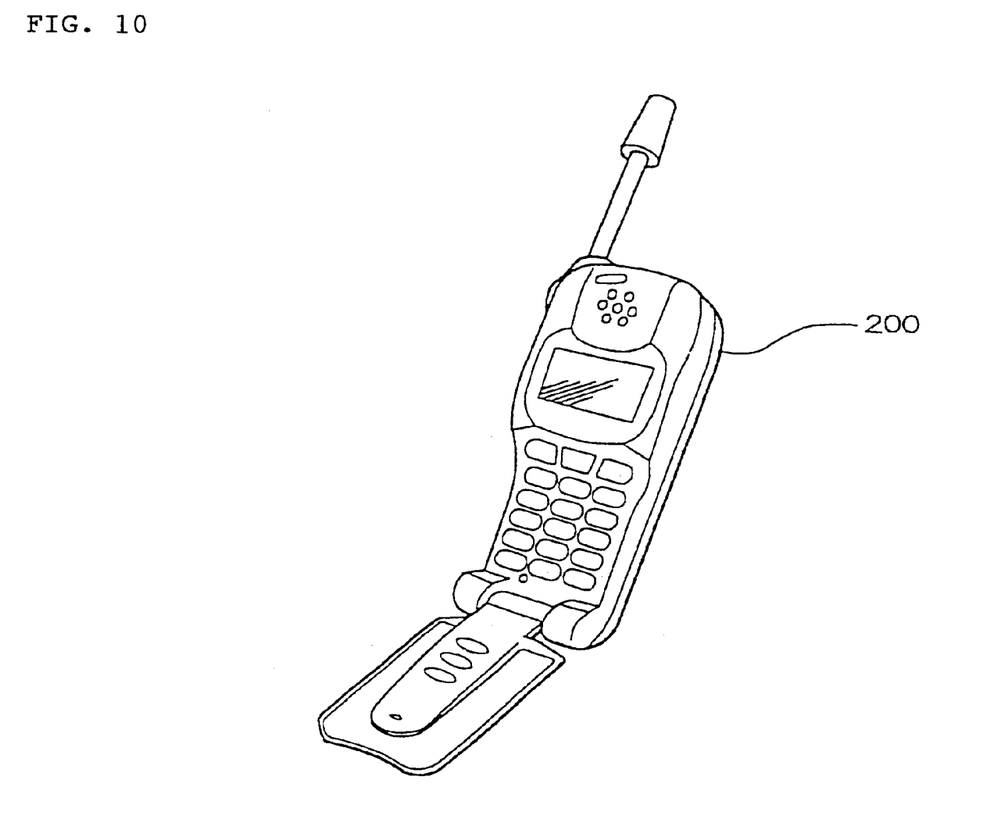
FIG. 10 is a diagram illustrating an electronic device having a semiconductor device according to an embodiment that applies the present invention.

Further, as electronic devices having the semiconductor device that applies the present invention, FIG. 9 depicts a notebook-sized personal computer 100 and FIG. 10 depicts a mobile telephone 200.

What is claimed is:

1. A method for fabricating a semiconductor device including a molding process, the molding process comprising:

setting a lead frame between a first mold and a second mold, the lead frame having portions to be sandwiched between the first and second molds and a die pad that is down set at a distance greater than a depth of a recessed part of said first mold, and the lead frame being set by placing the die pad on the bottom of the recessed part of the first mold so that the portions to be sandwiched are suspended above the first mold; and urging the first and second molds together to press the portions to be sandwiched in the direction of the first mold.

2. The method for fabricating the semiconductor device according to claim 1, a down set amount D of the die pad and a thickness T of a package formed in the molding process having the relationship:

$$D=(T/2)+(\text{approximately } 0.1 \text{ to } 0.2 \text{ mm}).$$

3. The method for fabricating the semiconductor device according to claim 1,
a pilot pin being disposed on the first mold to be received by a hole formed in the lead frame, and the pilot pin is fit into the hole to position the lead frame; and the pilot pin having a tapered tip end and a base end extending vertically from said first mold.

4. The method for fabricating the semiconductor device according to of claim 1, the lead frame having an outer frame and bridge pins that couple the die pad to the outer frame; and a down set amount D of the die pad being obtained by forming the bridge pins at an angle of generally 15° or greater with respect to the die pad.

5. A semiconductor device fabricated by the method for fabricating the semiconductor device according to claim 1.

6. A circuit board comprising the semiconductor device according to claim 5.

7. An electronic device comprising the semiconductor device according to claim 5.

* * * * *